(12) United States Patent
Boruta et al.

(10) Patent No.: US 10,811,503 B2
(45) Date of Patent: Oct. 20, 2020

(54) ELECTROSTATIC CATALYSIS

(71) Applicant: BECSIS, LLC, South Elgin, IL (US)

(72) Inventors: Nicholas Boruta, South Elgin, IL (US); Michael Boruta, South Elgin, IL (US)

(73) Assignee: BECSIS, LLC, South Elgin, IL (US)

( * ) Notice: Subject to any disclaimer, the term of this patent is extended or adjusted under 35 U.S.C. 154(b) by 0 days.

(21) Appl. No.: 16/330,461

(22) PCT Filed: Aug. 31, 2017

(86) PCT No.: PCT/US2017/049617
§ 371 (c)(1),
(2) Date: Mar. 5, 2019

(87) PCT Pub. No.: WO2018/048713
PCT Pub. Date: Mar. 15, 2018

(65) Prior Publication Data
US 2019/0207004 A1    Jul. 4, 2019

Related U.S. Application Data

(60) Provisional application No. 62/383,685, filed on Sep. 6, 2016.

(51) Int. Cl.
| H01L 29/792 | (2006.01) |
| H01L 21/8238 | (2006.01) |
| H01L 29/40 | (2006.01) |
| H01L 21/28 | (2006.01) |
| H01L 29/423 | (2006.01) |
| H01L 27/11563 | (2017.01) |
| H01L 29/66 | (2006.01) |
| H01L 29/861 | (2006.01) |

(52) U.S. Cl.
CPC ...... *H01L 29/408* (2013.01); *H01L 27/11563* (2013.01); *H01L 29/40117* (2019.08); *H01L 29/4234* (2013.01); *H01L 29/66833* (2013.01); *H01L 29/792* (2013.01); *H01L 29/8616* (2013.01)

(58) Field of Classification Search
CPC .................. H01L 27/11563; H01L 29/408
USPC .......................................... 438/216; 257/324
See application file for complete search history.

(56) References Cited

U.S. PATENT DOCUMENTS

| 6,688,179 B2 | 2/2004 | Potter et al. |
| 7,947,582 B2 * | 5/2011 | Hautala ............... H01L 29/7881 438/515 |

(Continued)

OTHER PUBLICATIONS

International Search Report & Written Opinion in International Application No. PCT/US2017/049617, dated Nov. 16, 2017 (6 pages).

(Continued)

*Primary Examiner* — Calvin Lee
(74) *Attorney, Agent, or Firm* — Foley & Lardner LLP

(57) ABSTRACT

An electrode having an embedded charge contains a substrate, a first electronic charge trap defined at the interface of a first insulating layer and a second insulating layer; and a first conductive layer disposed on the first electronic charge trap; wherein the first conductive layer contains a conductive material configured to permit an external electric field to penetrate the electrode from the first electronic charge trap; and wherein the first insulating layer is not the same as the second insulating layer.

9 Claims, 7 Drawing Sheets

$V_0$ is minimum required for Water Electrolysis to Proceed

(56) References Cited

U.S. PATENT DOCUMENTS

| | | | |
|---|---|---|---|
| 8,581,308 B2 | 11/2013 | Potter | |
| 9,425,396 B2 * | 8/2016 | Irwin | H01L 51/0003 |
| 9,704,956 B2 * | 7/2017 | Shepard | H01L 29/1606 |
| 9,837,611 B2 * | 12/2017 | Echegoyen | H01L 51/0035 |
| 2002/0012779 A1 | 1/2002 | Miyashita et al. | |
| 2005/0205966 A1 | 9/2005 | Potter | |
| 2007/0064468 A1 | 3/2007 | Seol et al. | |
| 2010/0221905 A1 | 9/2010 | Hautala et al. | |
| 2014/0315378 A1 | 10/2014 | Sato | |
| 2015/0295101 A1 | 10/2015 | Potter | |
| 2016/0284811 A1 * | 9/2016 | Yu | H01L 29/454 |

OTHER PUBLICATIONS

Kedzierski et al., "Validation of the trapped charge model of electrowetting contact angle saturation on lipid bilayers," Journal of Applied Physics 114, 024901 (2013).

Yang et al., "Isolated nanographene crystals for nano-floating gate in charge trapping memory," Scientific Reports 13: 21261 DOI: 10.1038/srep02126, Jul. 3, 2013.

* cited by examiner

ELECTROSTATIC CATALYSIS

CROSS-REFERENCE TO RELATED APPLICATIONS

This application is a U.S. National Phase Application under 35 U.S.C. § 371 of International Application No. PCT/US2017/049617, filed on Aug. 31, 2017, which claims benefit of priority to U.S. Provisional Application Ser. No. 62/383,685, filed Sep. 6, 2016, the entireties of which are incorporated by reference herein.

BACKGROUND

The present technology relates generally to the field of electrodes. More particularly, the present technology relates to electrodes for electrostatic catalysis.

SUMMARY

In one aspect, provided herein are electrodes having an embedded charge containing a substrate, a first electronic charge trap defined at the interface of a first insulating layer and a second insulating layer; and a first conductive layer disposed on the first electronic charge trap; wherein the first conductive layer contains a conductive material configured to permit an external electric field to penetrate the electrode from the first electronic charge trap; and wherein the first insulating layer is not the same as the second insulating layer. In some embodiments, the first conductive layer contains monoatomic graphene or molybdenum disulfide. In some embodiments, the substrate contains elemental silicon. In some embodiments, the first insulating layer contains a metal oxide. In some embodiments, the metal oxide contains silicon dioxide. In some embodiments, the second insulating layer contains silicon nitride, titanium dioxide, strontium titanium oxide, zirconium oxide, barium titanium oxide, or any combination of two or more thereof. In some embodiments, the electrode further contains a third insulating layer disposed adjacent to the second insulating layer, thereby forming a second charge trap at the interface of the second and third insulating layers, wherein the third insulating layer is not the same as the second insulating layer. In some embodiments, the electronic charge trap further contains a floating gate containing a conductor or semiconductor at the interface between the first and second insulating layers. In some embodiments, the floating gate contains a doped polysilicon. In some embodiments, the electrode is a cathode. In some embodiments, the electrode is an anode.

In another aspect, provided herein are methods of catalyzing a chemical reaction including contacting an electrolytic medium with an electrode described herein, wherein the chemical reaction takes place within the electrolytic medium. In some embodiments, the electrolytic medium contains a liquid medium, a solid medium, or a gel medium. In some embodiments, the method further includes generating an electric field through the interface of the liquid medium and the electrode, wherein the electric field originates from the electronic charge trap.

DETAILED DESCRIPTION

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and can be practiced with any other embodiment(s).

As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term.

The use of the terms "a" and "an" and "the" and similar referents in the context of describing the elements (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the embodiments and does not pose a limitation on the scope of the claims unless otherwise stated. No language in the specification should be construed as indicating any non-claimed element as essential.

As used herein, "embedded charge" refers to charges trapped at the interface between two dielectric, or insulating, layers, or to charges trapped within a floating-gate metal-oxide semiconductor field-effect transistor (floating-gate MOSFET or FGMOS).

As used herein, an insulating layer of "wide band gap" refers to an insulating layer having a band gap of over about 6.0 eV.

As used herein, an insulating layer of "low to medium band gap" or "narrow to medium band gap" refers to an insulating layer having a band gap of about 5.5 eV or less.

Provided herein, in one aspect, are electrodes for electrostatic catalysis. The electrodes described herein generate a high electric field from embedded charge within the electrode. The externally generated electric field can affect the potential energy barrier of a chemical reaction by decreasing the height and width of the energy barrier. In some embodiments, the electrode is used as an electrically-conducting electrode connectable to a power supply and as a source of a high electric field with no electrical shielding. In some embodiments, the electrode is used in redox reactions.

Figure 1:
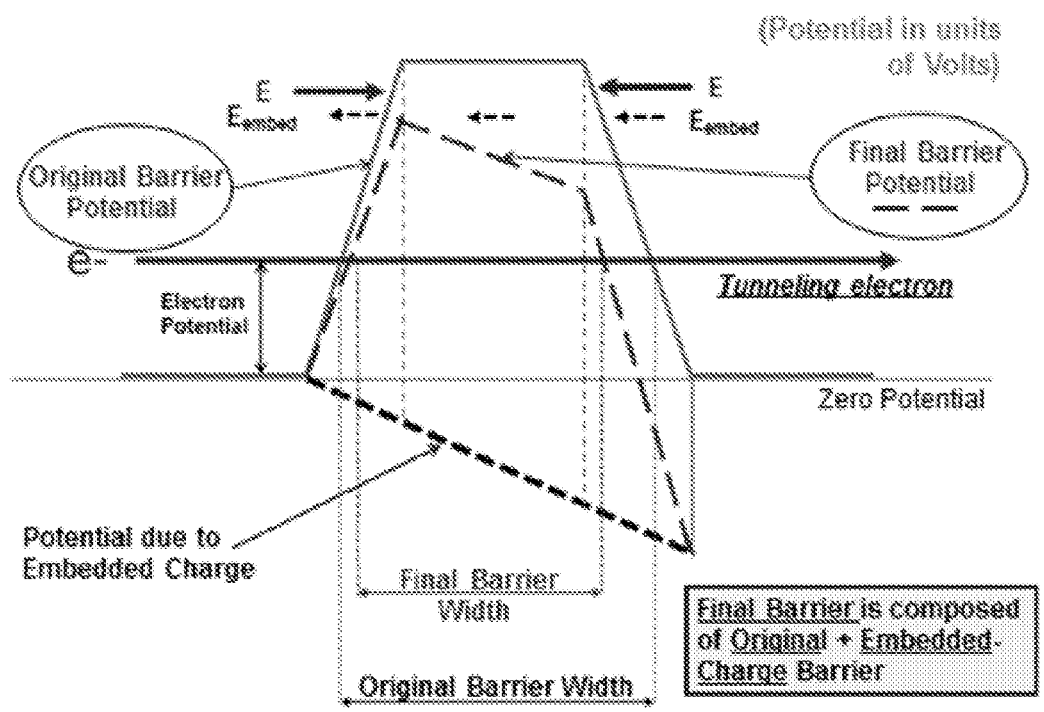
FIG. 1 shows a non-limiting example demonstrating how the width and height of a potential energy barrier is affected by an external electric field from an embedded charge.

FIG. 1 illustrates how an external electric field can affect a potential energy barrier. Also shown is the hypothetical energy barrier for electron tunneling, which is the primary process that occurs in electrochemical reactions where electrons tunnel between an electrode and the nearest molecule. The sum of the original barrier potential and the potential generated by the external electric field (due to the embedded charge) provides a "final barrier potential" with a lower height and narrowed width compared to the original barrier.

Figure 2:
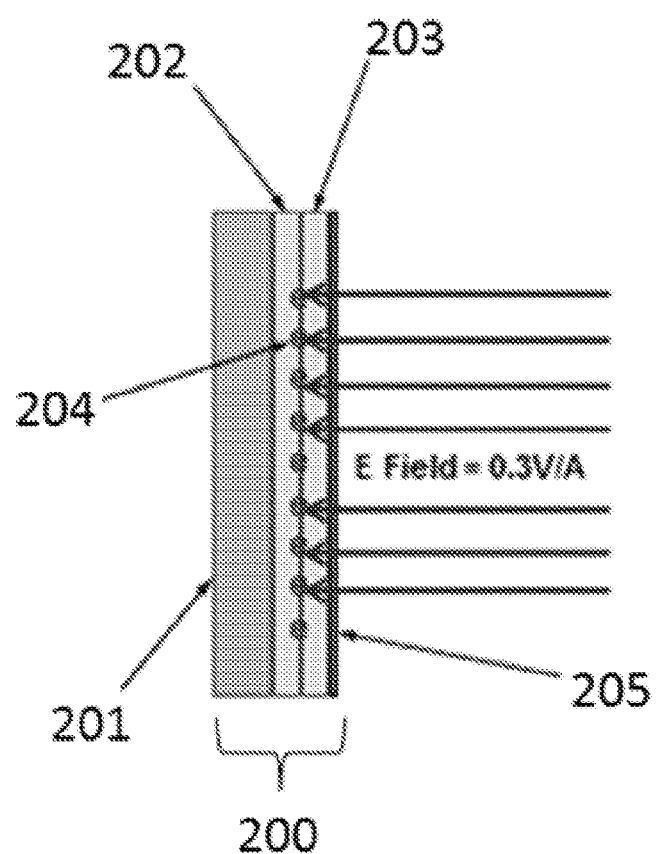
FIG. 2 shows the structure of a non-limiting example of an electrode with an electronic charge trap.

Referring to FIG. 2, in one non-limiting embodiment of an electrode (200) described herein, a 100 nm layer of silicon dioxide (202) is deposited on an N-type silicon wafer (201). A separate 100 nm silicon nitride layer (203) is deposited on top of the silicon dioxide layer (202), thereby creating an interface (204) with very strong electron-charge trapping properties between the silicon dioxide and silicon nitride layers. A monoatomic graphene layer (205) is deposited on top of the silicon nitride layer. Deposition can be conducted by chemical vapor deposition (CVD) or by other techniques such as sputtering, evaporation, atomic layer epitaxy, molecular beam epitaxy, or a combination thereof. The graphene layer (205) allows a significant portion of the electric field to pass through since its atomic thickness is less than its Debye length.

Figure 3:
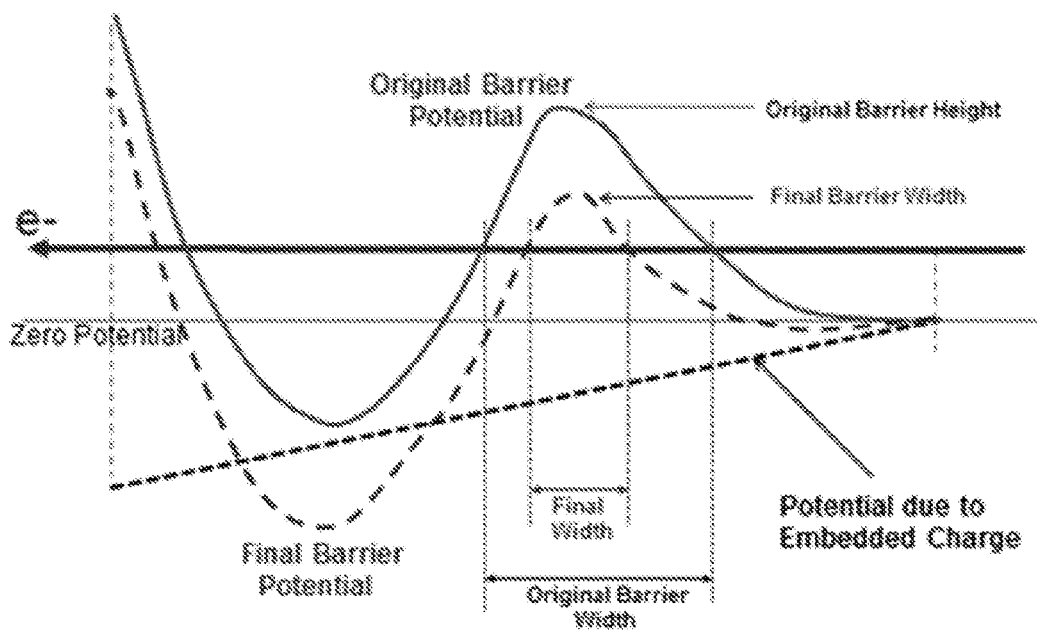
FIG. 3 shows a non-limiting example demonstrating how the width and height of a potential energy barrier is reduced to an incoming electron.

For an electrode having the configuration illustrated in FIG. 2, connection to an electrical power source enables the embedding of electrons using Fowler-Nordheim tunneling, wherein electrons are tunneled into the interface (as indicated by the arrows), resulting in the interface becoming the source of a high electric field. An electron density of $3 \times 10^{13}$ electrons/cm$^2$ has been demonstrated. The electric field may be as high as 30 megavolts/cm or about 0.3 V/Å. The monoatomic graphene layer exhibits good electrical conductivity, while permitting the penetration of the electric field generated by the embedded charge to reach beyond the electrode surface and into the electrolytic medium. In this way, the electric field can lower the potential energy barrier of a chemical reaction taking place within this location of the electrolytic medium. Another view of how the potential energy barrier is influenced by the electric field generated by the embedded charge is shown in FIG. 3. Alternatively, the electrons may be trapped ballistically using an electron gun. Such a method would not require that the electrode contain a conductive substrate such as silicon, but any substrate could be used to maintain the physical integrity of the electrode itself.

From the above descriptions of the figures, it is apparent that an external electric field can have a definite impact on the reaction energy barrier, assuming that the external field magnitude is on the order of the intra-molecular electric field. The details the magnitude of the external electric field and the reaction energy barrier, of course, depend on the specific reaction under consideration, but the primary physical mechanism underlying chemical reactions (namely the localized molecular-interaction electric fields) can be modified by an external electric field. In some cases the reaction barrier might be reduced, while in other cases the barrier might be increased—again, it depends on the specific chemical reaction.

Figure 4:
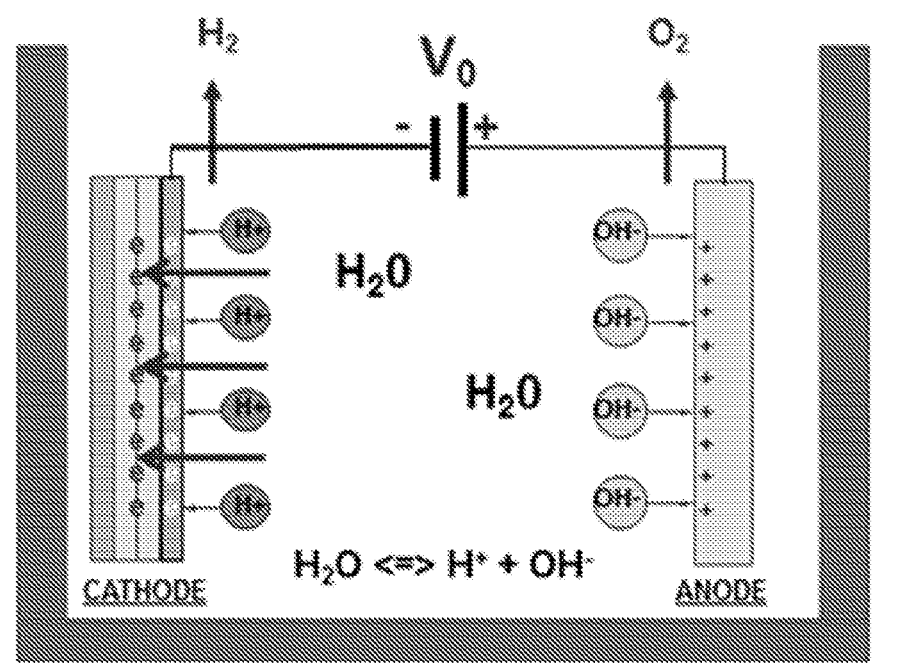
FIG. 4 shows a non-limiting example of water electrolysis using an electrode described herein.

FIG. 4 illustrates an idealized electrochemical reaction to show the impact of using an electrode with an embedded charge in the water electrolysis reaction. In FIG. 4, the cathode is an electrode having an embedded charge, and the cathode is connected to a monoatomic graphene conductor such that the molecules just to the right of the graphene will see a localized electric field pointing to the left, due to the power supply. Because of the embedded negative (−) charge at the dielectric interface of our electrode, an ADDITIONAL electric field will be observed which will ADD to the electric field generated by the power supply. This additional field will reduce the reaction potential barrier causing the reaction-rate to increase, without a subsequent increase in the supply voltage.

Researchers have recently shown that monoatomic graphene has an exceptionally high electrical conductivity, substantially higher than either copper or silver. So even though it is one atomic layer thick, it has the ability to carry a substantial current. Serge Luryi (*Appl. Phys. Lett.*, Vol 52, No. 6, 8 Feb. 1988) has shown that in spite of its high electrical conductivity, monoatomic graphene nevertheless allows a substantial fraction of the electrical field E (from the embedded charge in our case) to pass through the graphene, due to the quantum capacitance of the material. Electrostatic Screening is thus negligible especially when the electric field extends into the electrolyte over a very short distance (as it is for our electrochemical reaction example). This allows almost all of the electric field from the embedded charge to affect the reaction rate.

Figure 5:
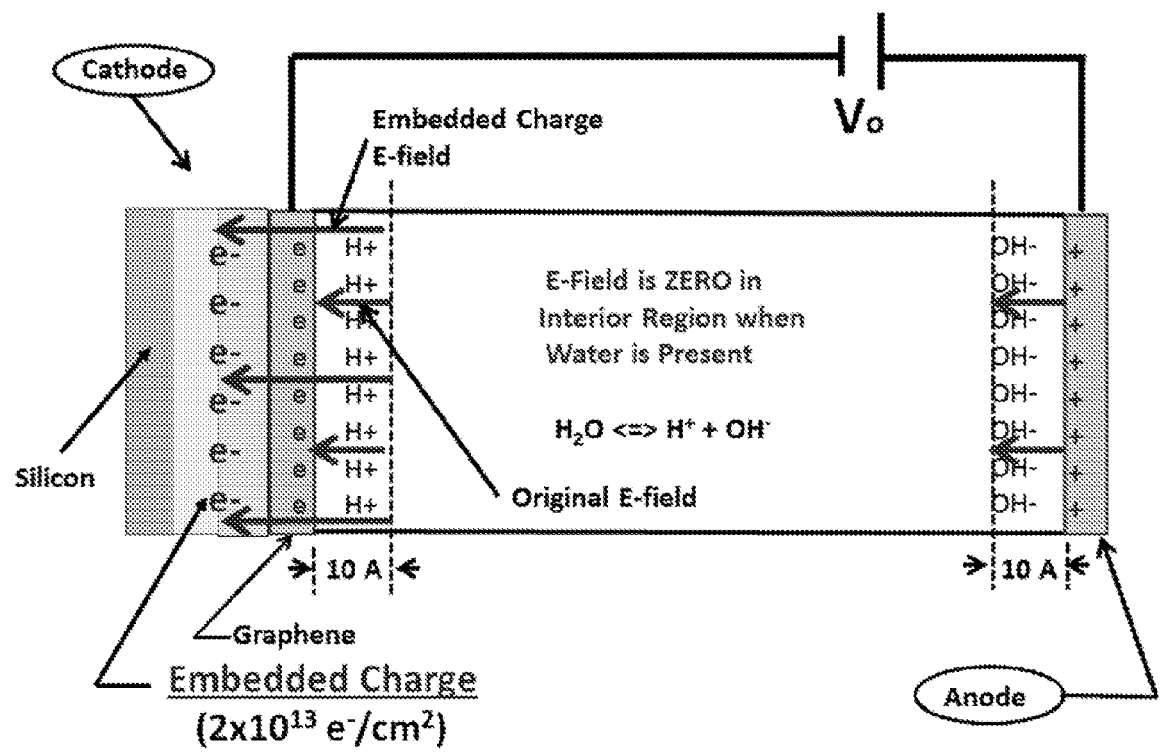
FIG. 5 shows a more detailed view of the electric field aspects of the example of FIG. 4.

FIG. 5 is a more detailed illustration of the electric field aspects as illustrated in FIG. 4. The power supply voltage generates an electric field across the electrolyte between the cathode and anode. However, the magnitude of this field is effectively zero within the electrolyte because of the conducting ions in the electrolyte which shield this field. Essentially all of the voltage from the power supply is dropped within a very small distance from either electrode which provides a field shown as the short arrows in the figure. This distance is on the order of several angstroms and effectively creates a double layer capacitor at each electrode. This field changes as the supply voltage changes. Independently, the field from the embedded charge (shown in the figure as the long arrows) penetrates the graphene layer and adds to the Supply Voltage generated field giving a net field that is substantially larger.

Figure 6:
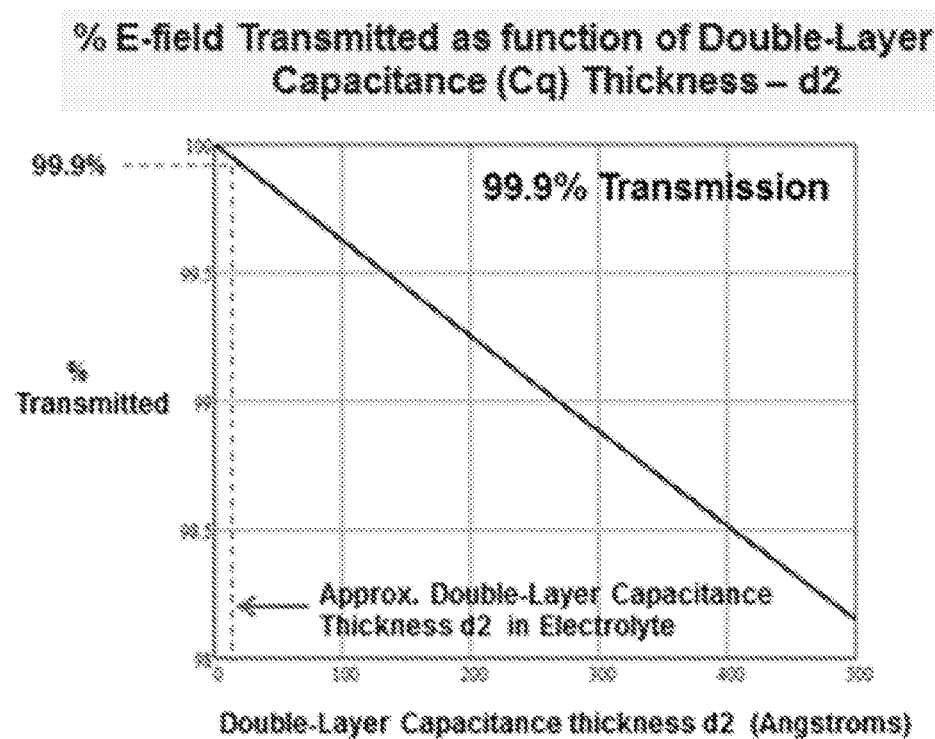
FIG. 6 shows a graph correlating the percent transmission of the electric field from the embedded charge of an electrode described herein with penetration distance through the monoatomic graphene layer.

Based on the work by Serge Luryi, we have derived an equation that predicts the percentage of the embedded charge generated electric field that penetrates through the graphene. FIG. 6 shows that more than 98 percent of the electric field penetrates the graphene into the electrolyte/electrode interface and is available for reducing the potential energy barrier to a distance of 500 Å from the graphene surface. In electrochemical reactions, the typical distance the electric field extends into the electrolyte is typically less than about 10 Å due to the high double layer capacitance, Cq, near the electrodes. Accordingly, the curve shows that, essentially, 100% of the electric field penetrates into the electrolyte/electrode interface region, despite graphene being an exceptionally good electrical conductor. The electrode having the embedded charge is configured to provide a strong electric field (of about 0.3 V/Å) that can reduce the reaction energy barrier of many electrochemical reactions. Because the electrostatic field approach generates the same reaction-increase that a catalyst provides, the effect is referred to herein as electrostatic catalysis.

Figure 7:
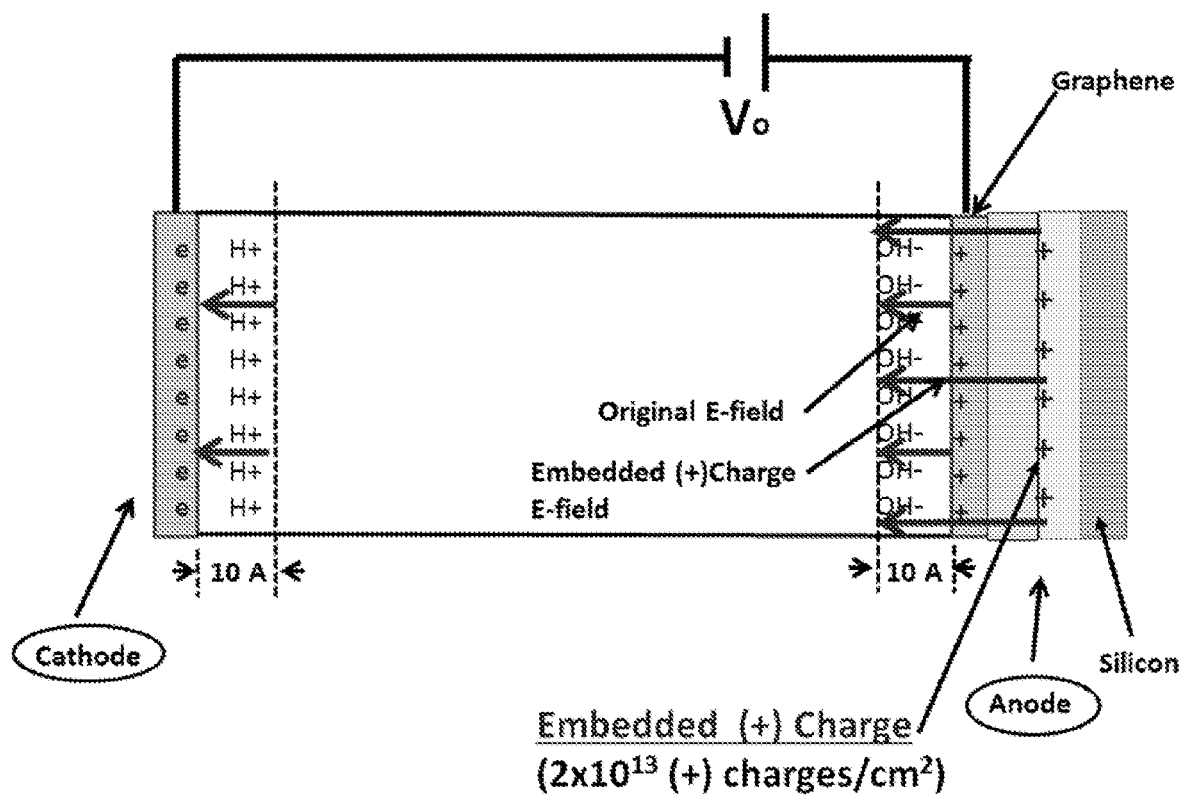
FIG. 7 shows a detailed view of the electric field aspects of another non-limiting example of the use of an electrode described herein.

A non-limiting example with positive embedded charge at the anode is shown in FIG. 7.

In some embodiments, the electrode having an embedded charge includes a substrate, a first electronic charge trap defined at the interface of a first insulating layer and a second insulating layer; and a first conductive layer disposed on the first electronic charge trap; wherein the first conductive layer contains a conductive material configured to permit an external electric field to penetrate the electrode from the first electronic charge trap. In some embodiments, the electrode further contains a third insulating layer located adjacent to the second insulating layer, thereby forming a second charge trap at the interface of the second insulating layer and the third insulating layer. In further embodiments, the second insulating layer and the third insulating layer are not the same.

In some embodiments, the electrode having an embedded charge includes a substrate, a first electronic charge trap defined at the interface of a first insulating layer and a second insulating layer; and a first conductive layer disposed on the first electronic charge trap; wherein the first conductive layer contains a conductive material configured to permit an external electric field to penetrate the electrode from the first electronic charge trap; and wherein the first insulating layer is not the same as the second insulating layer. In some embodiments, the electrode further contains a third insulating layer located adjacent to the second insulating layer, thereby forming a second charge trap at the interface of the second insulating layer and the third insulating layer. In further embodiments, the second insulating layer and the third insulating layer are not the same.

In some embodiments, the electrode having an embedded charge includes a substrate, a first electronic charge trap defined at the interface of a first insulating layer and a second insulating layer; a second charge trap defined at the interface of the second insulating layer and a third insulating layer; and a first conductive layer disposed on the first electronic charge trap; wherein the first conductive layer contains a conductive material configured to permit an external electric field to penetrate the electrode from one or more electronic charge traps.

In some embodiments, the electrode having an embedded charge includes a substrate, a set of alternating adjacent insulating layers of wide band gap or narrow to medium band gap, and a conductive layer disposed on the set of alternating adjacent insulating layers; wherein an electronic charge trap is defined at each interface of an insulating layer of wide band gap and an insulating layer of low to medium band gap; and the conductive layer contains a conductive material configured to permit an external electric field to penetrate the electrode from at least one electronic charge trap.

In some embodiments, the substrate contains elemental silicon. In some embodiments, the substrate contains N-type silicon.

In some embodiments, the electrode contains one or more electronic charge traps.

In some embodiments, an electronic charge trap is defined at the interface of a first insulating layer and a second insulating layer. In some embodiments, the electronic charge trap further includes a floating gate containing a conductor or semiconductor at the interface of the first and second insulating layers.

In some embodiments, an electronic charge trap is defined at the interface of each insulating layer of wide band gap and each insulating layer of narrow to medium band gap. In some embodiments, the electronic charge trap further includes a floating gate containing a conductor or semiconductor at the interface of the insulating layer of wide band gap and the insulating layer of narrow to medium band gap.

In some embodiments, an electronic charge trap is defined at the interface of each insulating layer of wide band gap and each insulating layer of narrow to medium band gap within a set of alternating adjacent insulating layers of wide band gap or narrow to medium band gap.

In some embodiments, the floating gate contains a doped polysilicon. A floating gate is capable of holding charges (e.g., electrons) in a similar manner as the interface between insulating layers of wide band gap and narrow to medium band gap in the absence of a floating gate. The difference between former and the latter is that embedded charges at the interface cannot generally be removed using an electric field whereas charges in a floating gate can be removed by applying a larger electric field.

In some embodiments, the set of alternating adjacent insulating layers of wide band gap or narrow to medium band gap contains 2, 3, 4, 5, 6, 7, 8, 9, or 10, or more layers. This includes a set of alternating adjacent insulating layers of wide band gap or narrow to medium band gap containing 2, 3, 4, or 5 layers. In some embodiments, the set of alternating adjacent insulating layers of wide band gap or narrow to medium band gap contains two insulating layers of wide band gap separated by an insulating layer of narrow to medium band gap. In some embodiments, the set of alternating adjacent insulating layers of wide band gap or narrow to medium band gap contains two insulating layers of narrow to medium band gap separated by an insulating layer of wide gap. In some embodiments, the set of alternating adjacent insulating layers of wide band gap or narrow to medium band gap contains two insulating layers of wide band gap and two insulating layers of narrow to medium band gap. In some embodiments, the set of alternating adjacent insulating layers of wide band gap or narrow to medium band gap contains three insulating layers of wide band gap, each separated by an insulating layer of narrow to medium band gap. In some embodiments, the set of alternating adjacent insulating layers of wide band gap or narrow to medium band gap contains three insulating layers of narrow to medium band gap, each separated by an insulating layer of wide band gap.

The first insulating layer may include silicon dioxide, calcium fluoride, magnesium fluoride, lithium fluoride, aluminum oxide, or any combination of two or more thereof. The first insulating layer may include a metal oxide. Illustrative metal oxides include, but are not limited to, silicon dioxide, aluminum oxide, or a combination thereof.

Insulating layers of wide band gap include, but are not limited to, silicon dioxide, calcium fluoride, magnesium fluoride, lithium fluoride, aluminum oxide, or any combination of two or more thereof. For example, silicon dioxide has band gap of approximately 9 eV and calcium fluoride has a band gap of approximately 12.1 eV. The insulating layers of wide band gap may all be the same or different. One or more of the insulating layers of wide band gap may be the same. One or more of the insulating layers of wide band gap may be different.

The second insulating layer may include silicon nitride, titanium dioxide, strontium titanium oxide, zirconium oxide, barium titanium oxide, or any combination of two or more thereof.

Insulating layers of low to medium band gap include, but are not limited to, silicon nitride, titanium dioxide, strontium titanium oxide, zirconium oxide, barium titanium oxide, or any combination of two or more thereof. For example, silicon nitride has a band gap of approximately 5 eV. The insulating layers of low to medium band gap may all be the same or different. One or more of the insulating layers of low to medium band gap may be the same. One or more of the insulating layers of low to medium band gap may be different.

The third insulating layer may include silicon dioxide, calcium fluoride, magnesium fluoride, lithium fluoride, aluminum oxide, or any combination of two or more thereof. The third insulating layer may include a metal oxide. Illustrative metal oxides include, but are not limited to, silicon dioxide, aluminum oxide, or a combination thereof.

In some embodiments, the conductive layer is disposed on the first electronic charge trap. In some embodiments, the conductive layer is disposed on a set of alternating adjacent insulating layers of wide band gap or narrow to medium band gap. The outer surface of the conductive layer serves as the outer surface of the electrode itself.

The conductive layer may contain a conductive material configured to permit an external electric field to penetrate the electrode from the electronic charge trap. In some embodiments, the conductive material contains monoatomic graphene or molybdenum disulfide.

In some embodiments, the electrode is a cathode. In some embodiments, the electrode is a cathode and the embedded charge is negative. In some embodiments, the electrode is an anode. In some embodiments, the electrode is an anode and the embedded charge is positive.

Provided herein, in another aspect, are methods of catalyzing a chemical reaction, wherein the method includes contacting an electrolytic medium with an electrode described herein and the chemical reaction takes place within the electrolytic medium. In some embodiments, the electrolytic medium is a liquid medium, a solid medium, or a gel medium. In some embodiments, the method further includes generating an electric field through the interface of the liquid medium and the electrode, wherein the electric field originates from the electronic charge trap. In some embodiments, the chemical reaction is a redox reaction.

While certain embodiments have been illustrated and described, it should be understood that changes and modifications can be made therein in accordance with ordinary skill in the art without departing from the technology in its broader aspects as defined in the following claims.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

The present disclosure is not to be limited in terms of the particular embodiments described in this application. Many modifications and variations can be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

All publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

Para. A. An electrode having an embedded charge comprising:
  a substrate;
  a first electronic charge trap defined at the interface of a first insulating layer and a second insulating layer; and
  a first conductive layer disposed on the first electronic charge trap;
  wherein:
  the first conductive layer comprises a conductive material configured to permit an external electric field to penetrate the electrode from the first electronic charge trap; and
  wherein the first insulating layer is not the same as the second insulating layer.

Para. B. The electrode of Para. A, wherein the first conductive layer comprises monoatomic graphene or molybdenum disulfide.

Para. C. The electrode of Para. A or Para. B, wherein the substrate comprises elemental silicon.

Para. D. The electrode of any one of Paras. A-C, wherein the first insulating layer comprises a metal oxide.

Para. E. The electrode of Para. D, wherein the metal oxide comprises silicon dioxide.

Para. F. The electrode of any one of Paras. A-E, wherein the second insulating layer comprises silicon nitride, titanium dioxide, strontium titanium oxide, zirconium oxide, barium titanium oxide, or any combination of two or more thereof.

Para. G. The electrode of any one of Paras. A-F, wherein the electrode further comprises a third insulating layer disposed adjacent to the second insulating layer, thereby forming a second charge trap at the interface of the second and third insulating layers, wherein the third insulating layer is not the same as the second insulating layer.

Para. H. The electrode of Para. A, wherein the electronic charge trap further comprises a floating gate comprising a conductor or semiconductor at the interface between the first and second insulating layers.

Para. I. The electrode of Para. H, wherein the floating gate comprises a doped polysilicon.

Para. J. The electrode of any one of Paras. A-I, wherein the electrode is a cathode.

Para. K. The electrode of any one of Paras. A-I, wherein the electrode is an anode.

Para. L. A method of catalyzing a chemical reaction comprising contacting an electrolytic medium with an electrode of any one of Paras. A-K, wherein the chemical reaction takes place within the electrolytic medium.

Para. M. The method of Para. L, wherein the electrolytic medium comprises a liquid medium, a solid medium, or a gel medium.

Para. N. The method of Para. L or Para. M, further comprising generating an electric field through the interface of the liquid medium and the electrode, wherein the electric field originates from the electronic charge trap.

Other embodiments are set forth in the following claims.

What is claimed is:

1. An electrode having an embedded charge, the electrode consisting essentially of:
   a substrate;
   a first electronic charge trap defined at the interface of a first insulating layer and a second insulating layer;
   a first conductive layer disposed on the first electronic charge trap; and
   optionally a third insulating layer disposed adjacent to the second insulating layer, thereby forming a second charge trap at the interface of the second and third insulating layers;
   wherein:
   the first conductive layer comprises a conductive material configured to permit an external electric field to penetrate the electrode from the first electronic charge trap;
   wherein the first insulating layer is not the same as the second insulating layer; and
   wherein the third insulating layer is not the same as the second insulating layer.

2. The electrode of claim 1, wherein the electrode further comprises a third insulating layer disposed adjacent to the second insulating layer, thereby forming a second charge trap at the interface of the second and third insulating layers, wherein the third insulating layer is not the same as the second insulating layer.

3. The electrode of claim 1, wherein the second insulating layer comprises silicon nitride, titanium dioxide, strontium titanium oxide, zirconium oxide, barium titanium oxide, or any combination of two or more thereof.

4. The electrode of claim 1, wherein the first conductive layer comprises monoatomic graphene or molybdenum disulfide.

5. The electrode of claim 1, wherein the substrate comprises elemental silicon.

6. The electrode of claim 1, wherein the electrode is a cathode.

7. The electrode of claim 1, wherein the electrode is an anode.

8. The electrode of claim 1, wherein the first insulating layer comprises a metal oxide.

9. The electrode of claim 8, wherein the metal oxide comprises silicon dioxide.

* * * * *